(12) United States Patent
Golz

(10) Patent No.: US 6,563,201 B1
(45) Date of Patent: May 13, 2003

(54) SYSTEM CARRIER FOR A SEMICONDUCTOR CHIP HAVING A LEAD FRAME

(75) Inventor: Bruno Golz, Jesenwang (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/816,930

(22) Filed: Mar. 23, 2001

(30) Foreign Application Priority Data

Mar. 23, 2000 (DE) .......................................... 100 14 306

(51) Int. Cl.⁷ .......................... H01L 23/495; H01L 23/13
(52) U.S. Cl. .................... 257/672; 257/666; 257/668; 257/670; 257/671; 257/674; 257/676; 257/690; 257/696
(58) Field of Search ........................... 257/666, 669, 257/670, 671, 672, 674, 675, 676, 696, 698, 773, 775, 776

(56) References Cited

U.S. PATENT DOCUMENTS

| 5,708,293 A | * | 1/1998 | Ochi et al. ................... 257/666 |
| 5,866,939 A | * | 2/1999 | Shin et al. ................... 257/666 |
| 6,011,220 A | | 1/2000 | Bando et al. |
| 6,075,283 A | * | 6/2000 | Kinsman et al. ............. 257/676 |
| 6,144,088 A | * | 11/2000 | Pohl et al. .................... 257/666 |
| 6,215,177 B1 | * | 4/2001 | Corisis et al. ................ 257/666 |
| 6,246,110 B1 | * | 6/2001 | Kinsman et al. ............. 257/672 |
| 6,262,475 B1 | * | 7/2001 | Liu et al. ...................... 257/675 |
| 6,297,544 B1 | * | 10/2001 | Nakamura et al. ........... 257/666 |
| 6,329,705 B1 | * | 12/2001 | Ahmad ........................ 257/666 |

FOREIGN PATENT DOCUMENTS

| DE | 198 35 393 A1 | 11/1999 |
| JP | 09 116 074 A | 5/1997 |
| JP | 11 045 973 A | 2/1999 |

* cited by examiner

Primary Examiner—Nathan J. Flynn
Assistant Examiner—Johannes P Mondt
(74) Attorney, Agent, or Firm—Laurence A. Greenberg; Werner H. Stemer; Ralph E. Locher

(57) ABSTRACT

A system substrate for a semiconductor chip has a conductor frame (1); many small-area signal flat conductors (4) extend from webs (2, 3) of the conductor frame and on their free ends have contact terminal faces (5). Remaining faces (6) between the webs (2, 3) and the many signal flat conductors (4) are occupied by large-area flat conductors (7). Between the large-area flat conductors (7) and the webs (2, 3), there are connecting webs (9) with bent areas (8) at various spacings from the webs (2, 3).

12 Claims, 5 Drawing Sheets

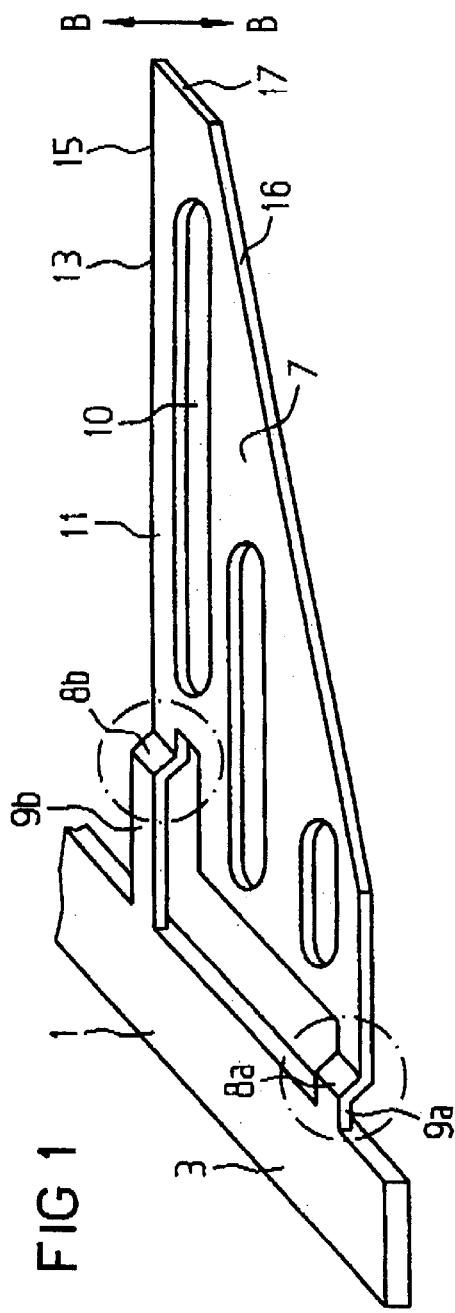
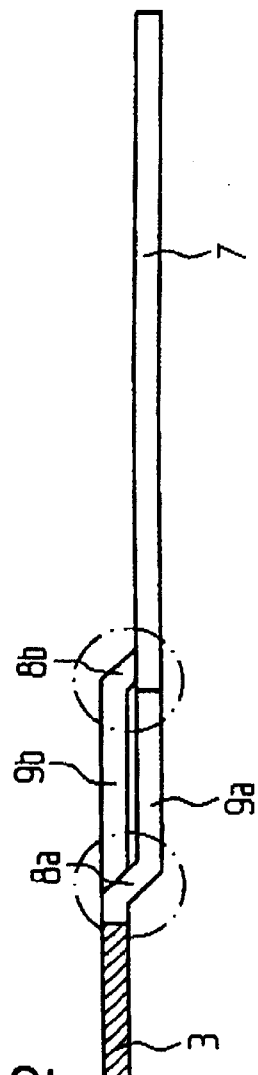
FIG 1
FIG 2

SYSTEM CARRIER FOR A SEMICONDUCTOR CHIP HAVING A LEAD FRAME

BACKGROUND OF THE INVENTION

Field of the Invention

The invention relates to a system carrier or substrate for a semiconductor chip with a conductor frame.

Such system substrates are used in semiconductor technology for retaining flat conductors of various sizes at predetermined positions on longitudinal webs and transverse webs of a conductor frame. Small-area flat conductors that extend from the webs are provided on their free ends with contact terminal faces. These contact terminal faces are connected to microscopically small contact terminals, that is, contact terminals that are perceptible only under a light microscope, on the semiconductor chip, in particular via bonding wires using wire bonding technology or via solder bumps using flip-chip technology. Large-area flat conductors are provided for carrying current or are provided as volumetric balancing pieces. Between the large-area flat conductors and the webs of the conductor frame, there are connecting webs that have bent areas.

In this connection, the term "large area" pertaining to the flat conductors means a multiple of the area of a small-area, elongated signal flat conductor. Large-area flat conductors can for example have a trapezoidal or triangular shape, depending on the remaining faces between the conductor frame and the signal flat conductors. Large-area flat conductors have a tendency, when the system substrate is encapsulated in a plastic casting composition, to change their predetermined position and to threaten bonding connections.

SUMMARY OF THE INVENTION

The object of the invention is to avoid breakage of bonding connections upon encapsulation, by means of a suitable system substrate.

According to the invention, the bent areas in the connecting webs, for large-area flat conductors, are provided at different spacings from the webs of the conductor frame, so that no coincident pivot axis for the bent areas about which the large-area flat conductors could swivel elastically, shift, or vibrate can form, since the bent areas are disposed at different spacings from the webs of the conductor frame. This also fixes the three-dimensional position of the large-area flat conductors, so that their free ends can no longer swing unhindered. Overall, without having to introduce additional bent areas in the connecting webs and without having to use more dimensionally stable materials, the rigidity of the large-area flat conductors is increased.

In one embodiment of the invention, the large-area flat conductors have oblong-slotlike openings, which are dimensioned such that the remaining flat conductor material is given a width adapted to the signal flat conductors. This embodiment has the advantage that in the remaining trapezoidal or large-area faces between the webs and the many signal flat conductors, the shrinkage of the plastic casting composition in the injection molding operation for a plastic semiconductor housing is made uniform in all regions of the system substrate, and thus sagging and rejection of the plastic housing for a semiconductor chip is reduced.

To that end, in a Cartesian coordinate system the conductor frame extends in the X-Y direction, and the bent areas are disposed in the Z directions. The large-area flat conductors are located in a plane that is offset in the Z direction from the plane of the signal flat conductors. This offset is first for historical reasons and corresponds to the applicable thickness of the semiconductor chip, so that the large-area flat conductors can be connected to the underside of the semiconductor chip. However, since for the above reasons this connectability is no longer necessary for modern semiconductor chips or can no longer be achieved, these bent areas of the connecting webs between large-area flat conductors and webs of the conductor frame serve to dispose the flat conductors in an offset plane, to lend improved stability to the plastic semiconductor housing.

Because of the increased rigidity from the offset arrangement of the bent areas in the connecting webs, the vibrations of the large-area flat conductors are reduced to such an extent that the aforementioned negative effects no longer occur, and the bonding wire connections are not threatened. In the injection molding of the plastic housing, a stabler state of the system substrate is thus achieved.

In a further embodiment of the invention, a single large-area flat conductor has two connecting webs to one web of the conductor frame, and one of the connecting webs has its bent areas in the Z direction at a greater spacing from the web of the conductor frame than the other. This is advantageously the simplest embodiment of the present invention.

In a further embodiment, a single large-area flat conductor has three connecting webs, and a middle connecting web has its bent areas in the Z direction at a greater spacing from the web of the conductor frame than the other two connecting webs. Compared with the simplest embodiment, referred to above, this embodiment has the additional advantage that with three connecting webs and with corresponding bent areas offset in spacing, the rigidity and positional accuracy of the large-area flat conductor can be increased considerably; the middle connecting web can protrude with its bent areas as far as the center of the large-area flat conductor.

The middle connecting web of a large-area flat conductor with three connecting webs can, in a further embodiment, have a bent area in the Z direction at a lesser spacing from the web of the conductor frame than the other two connecting webs. In that case, the peripheral zones of the large-area flat conductor are shortened considerably, and the middle region of the flat conductor is lengthened accordingly, so that a stable position of the large-area flat conductor can be assured.

In a further embodiment, a single large-area flat conductor can have a plurality of connecting webs to one web, with two different spacings of the bent area of the connecting webs from the web of the conductor frame; the bent areas are disposed at alternating spacings from the web of the conductor frame. This embodiment of the invention should be used particularly whenever area of the large-area flat conductor becomes greater because of increasing chip sizes and increasing signal conductor tracks. The alternating arrangement of the spacings of the bent areas of the connecting webs furthermore has the advantage that the large-area flat conductor is stiffened at a plurality of points.

In a further embodiment of the invention, in a large-area flat conductor with a plurality of connecting webs to one web of the conductor frame, the bent areas are disposed in groups with regard to the spacings, and the group of connecting webs having the greatest spacing of the bent areas from the web are disposed in the region of the greatest length of the large-area flat conductor. It is thus advantageously assured that the greatest length of the large-area flat conductor is shortened, since the connecting webs are lengthened accordingly, so that the bent areas will attain a greater spacing from the web of the conductor frame. Compared with an alternating arrangement of the spacings of the bent areas from the transverse web, this offers enhanced stability, especially for the longest length of the large-area flat conductor.

With a further embodiment of the invention, the bent areas can be staggered with regard to the spacings from the web; the connecting web with the greatest spacing of the bent areas from the web of the semiconductor chip is disposed in the region of the longest length of the large-area flat conductor. Although the tool for countersinking the bent areas in a staggered way is more complex in structure than if only two different magnitudes of spacing had to be taken into account, nevertheless the staggering of the spacings of the bent areas in the connecting webs offers the greatest possible rigidity for the large-area flat conductors and thus the greatest possible stability of the substrate system upon encapsulation of an electronic semiconductor circuit in a plastic housing.

Embodiments of the invention will now be described in further detail in conjunction with drawings.

BRIEF DESCRIPTION OF THE DRAWING

FIG. 1 shows a perspective view of a detail of a system substrate for a semiconductor chip, in a first embodiment of the invention.

FIG. 2 shows a cross sectional view of the system substrate of FIG. 1.

DESCRIPTION OF THE PREFERRED EMBODIMENTS

Figure 3:
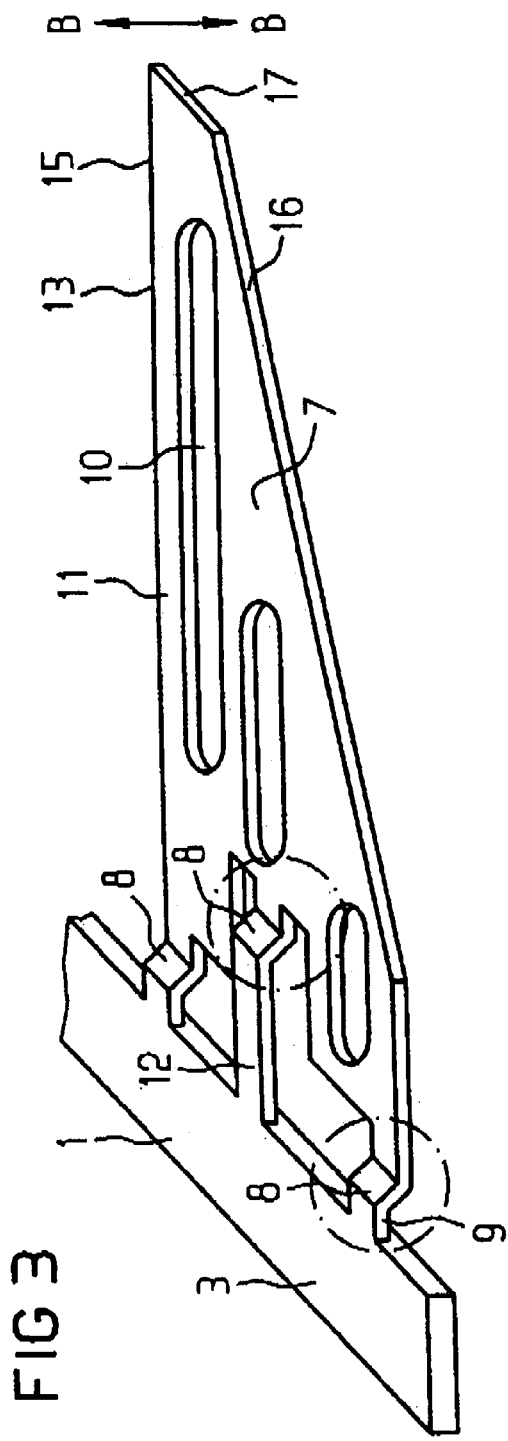
FIG. 3 shows a perspective view of a detail of a system substrate for a semiconductor chip, in a second embodiment of the invention.

FIG. 1 shows a perspective view of a detail of a system substrate for a semiconductor chip in a first embodiment of the invention. Of the conductor frame 1, this detail shows a portion of a transverse web 3, on which two connecting webs 9a and 9b with bent areas 8a and 8b are provided. The large-area flat conductor 7 is defined by a longitudinal leg 15 and a transverse leg 16, which end at the free end 17. The large-area flat conductor 7 has oblong-slotlike openings 10, which are dimensioned such that the remaining material forms eleven webs, which correspond in their width to the signal flat conductors shown in FIG. 7. The spacings of the bent areas 8a and 8b from the transverse web 3 differ and do not form any common aligned bending line.

FIG. 2 shows the difference in spacing of the bent areas 8a and 8b from the transverse web 3 in cross section. Because of this difference, the large-area flat conductor 7 is stabilized in such a way that its free end 17 can vibrate with an extremely slight amplitude in the direction of the arrow B. Thus the large-area flat conductor 7 is stabilized and stiffened in its three-dimensional position on the system substrate, so that the risk of breakage of bonding connections or contact bump connections in the injection molding process of a plastic casting composition for forming a semiconductor housing is lessened.

FIG. 3 shows a perspective view of a detail of a system substrate for a semiconductor chip in a second embodiment of the invention, in which instead of two connecting webs, three connecting webs 9 connect the large-area flat conductor 7 to a transverse web 3 of the conductor frame 1 via the bent areas 8. With this embodiment, the spacing of the bent area 8 of the middle connecting web 12 from the transverse web 3 is greater than the spacing of the two outer bent areas 8. Thus in particular the middle region of the large-area flat conductor is stabilized, and vibration of the free end 17 of the large-area flat conductor 7 in the direction of the arrows B is reduced sharply. Since no common bending edge for the large-area flat conductor 7 can develop at the three bent areas, the plane of the large-area flat conductor that is offset from the conductor frame 1, is spatially stabilized.

Figure 4:
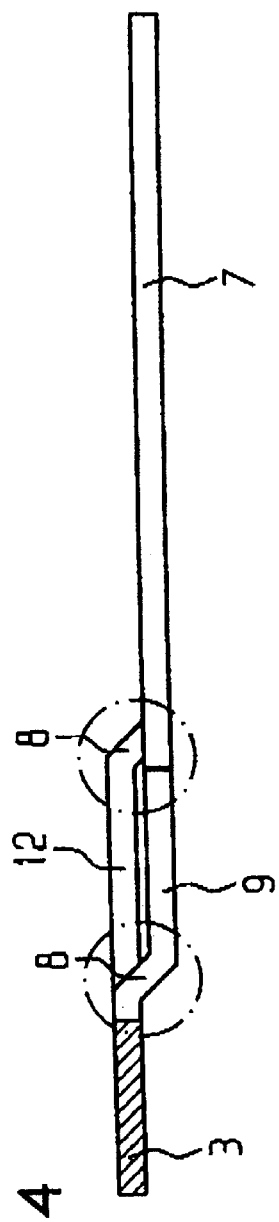
FIG. 4 shows a cross sectional view of the system substrate of FIG. 3.

FIG. 4 shows a cross section through the system substrate of FIG. 3 and shows the increased length of the middle connecting web 12 compared to the outer connecting webs 8 and 9, whose bent areas 8 directly adjoin the transverse web 3 of the conductor frame 1.

Figure 5:
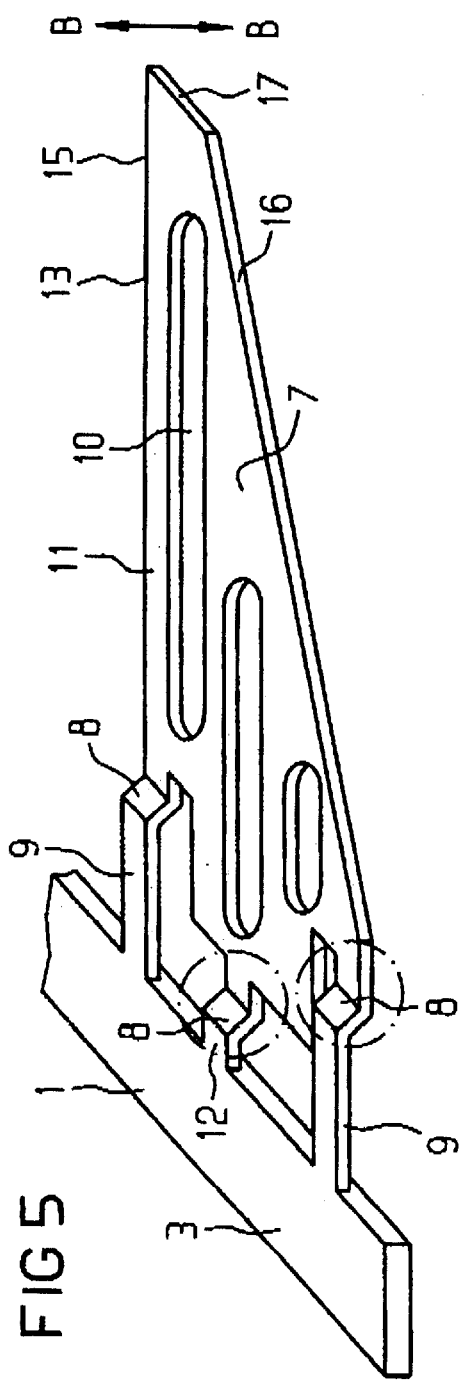
FIG. 5 shows a perspective view of a detail of a system substrate for a semiconductor chip, in a third embodiment of the invention.

FIG. 5 shows a perspective view of a detail of a system substrate for a semiconductor chip in a third embodiment of the invention. In this embodiment as well, only three connecting webs 9 with bent areas 8 for the transverse web 3 of the conductor frame are provided, but with the difference that the bent areas 8 of the middle connecting web 12 are at a lesser spacing from the transverse web 3 of the conductor frame 1. With this third embodiment of the invention, in particular the longitudinal leg 15 and the transverse leg 16 are stiffened compared with the middle of the large-area flat conductor 7, so that the vibration amplitude in the direction of the arrow B is sharply limited.

Figure 6:
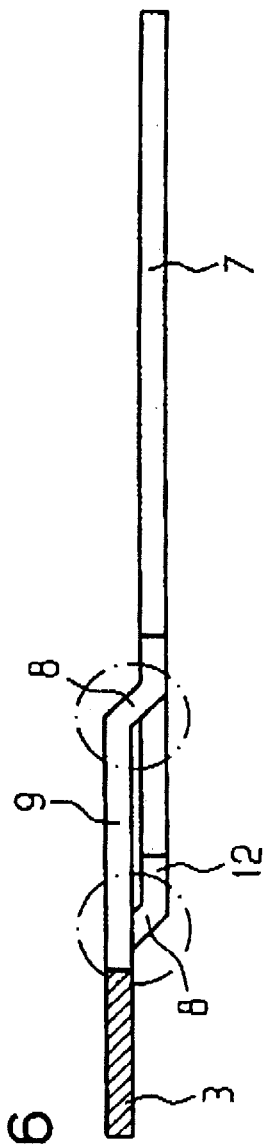
FIG. 6 shows a cross sectional view of the system substrate of FIG. 5.

FIG. 6 shows a cross sectional view of FIG. 5 and shows the increased length of the outer connecting webs 9 compared with the middle connecting web 12, whose bent areas 8 directly adjoin the transverse web 3 of the conductor frame 1.

Figure 7:
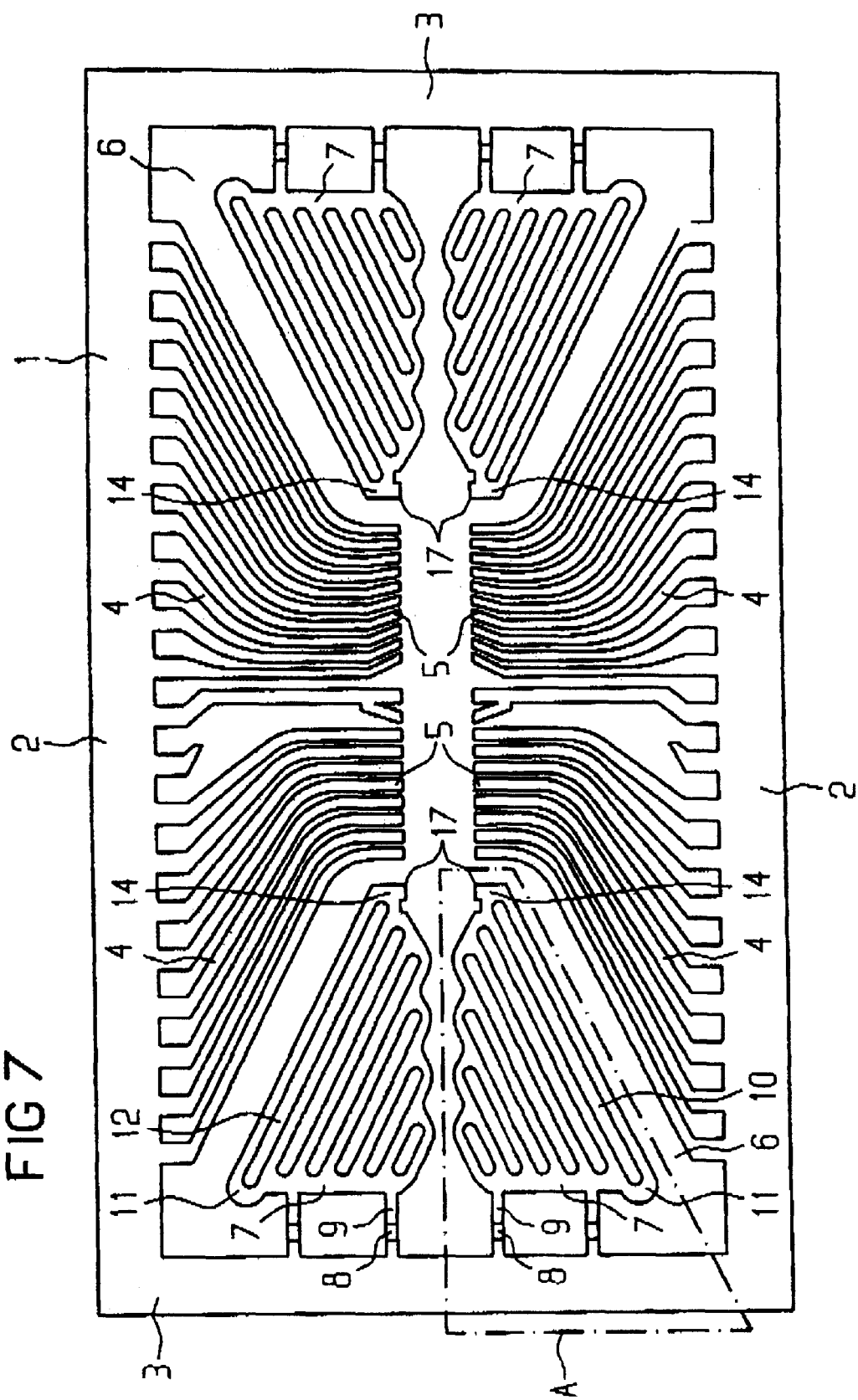
FIG. 7 shows a plan view on a further system substrate.

FIG. 7 shows one possible further embodiment of the system substrate in a plan view. Particular with rectangular conductor frames 1, remaining trapezoidal or large-area faces develop between the transverse webs 3 and many signal flat conductors 4, in which either flat conductors 7 are disposed and are provided for supplying current, or which have large-area flat conductors 7 that are intended merely as volumetric balancing pieces. The large-area flat conductors 7 are secured to the transverse webs 3 via connecting webs 9 that have bent areas 8.

In the plan view of FIG. 7, up to forty signal flat conductors 4 are disposed on the longitudinal webs 2 of the conductor frame 1; on their free ends, they have contact terminal faces 5, which are connected to contact terminals on a semiconductor chip either via bonding wires using wire bonding technology or via solder bumps using flip-chip technology. Between the transverse webs 3 of the conductor frame 1 and the signal flat conductors 4, there are trapezoidal faces 6, which in the concluding potting of the system substrate with a plastic casting composition can cause arching of the semiconductor housing and for this reason are occupied by large-area flat conductors 7 as volumetric balancing pieces. However, these large-area flat conductors 7 can also serve to supply current to the semiconductor chip, to which purpose the free ends of the large-area flat conductors are embodied as contact terminal faces 14, from which the semiconductor chip can be supplied with current through multiple bonding wires or corresponding contact bumps. These large-area flat conductors 7 are connected to the transverse webs 3 of the conductor frame via connecting webs 9. These connecting webs 9 have bent areas 8, to stiffen the connecting webs.

These bent areas 8 are placed for stiffening purposes in the connecting webs 9 at different spacings from the transverse webs 3, in order to prevent yielding or vibration of the large-area flat conductors 7, especially during the injection molding operation when the semiconductor housing is cast. If the spacings of the bent areas 8 are equal, the large-area flat conductors can relatively easily change their position during the injection operation, so that in the injection molding operation an unstable state can occur, which can adversely affect the shaping of the semiconductor housing, especially if the large-area flat conductors 7 are intended as volumetric balancing pieces.

Figure 8:
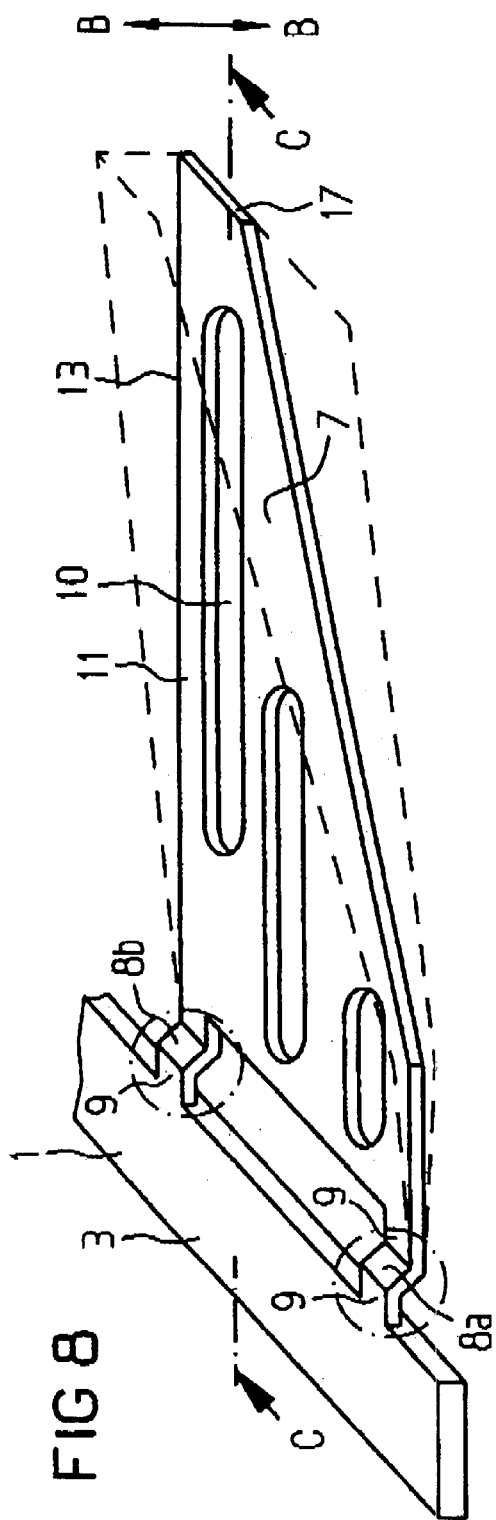
FIG. 8 shows a basic layout of a large-area flat conductor in a perspective view.

FIG. 8 shows a basic layout of a large-area flat conductor 7, which is connected to a transverse web 3 of a conductor frame 1 via two connecting webs 9, as seen for the system substrate of FIG. 7 in the region marked A. The bent areas 8 have the same spacings from the transverse webs in this example. FIG. 8 thus shows the vibration-threatened arrangement of bent areas 8 in the connecting webs 9. The bent areas 8 in FIG. 8 are aligned with one another and form a vibration axis or bending line, about which the large-area flat conductor 7 can vibrate with great amplitude in the direction of the arrow B, which can cause considerable problems in the ensuing injection molding process. One possible way to solve these problems is for the large-area flat conductors to be connected directly to one another via the underside of the semiconductor chip. Because of the miniaturization of the contact faces on the chip itself and the attendant shortened chip length, however, there is no longer enough space for this to accommodate free ends 17 of the large-area flat conductors 7 on the underside of the chip of the semiconductor component, and so in the injection molding of the semiconductor housing, the free ends 17 of the large-area flat conductors 7 can vibrate by the large amplitude shown in FIG. 8 in the direction of the arrow B.

Figure 9:
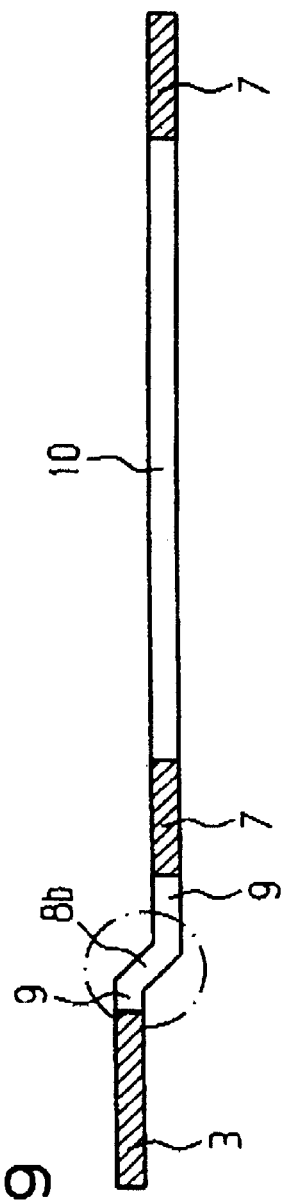
FIG. 9 shows a cross section of the large-area flat conductor of FIG. 8 along a section line C—C.

FIG. 9 shows a cross section of the large-area flat conductor 7 of FIG. 8 along a section line C—C and clearly shows that the bent areas are disposed on a common aligned bending line, about which the large-area flat conductors can vibrate, swivel or bend.

What is claimed is:

1. A system carrier for a semiconductor chip having contact terminals, the system carrier comprising:

a conductor frame divided into a plurality of conductor frame webs including longitudinal webs and transverse webs;

said conductor frame including a plurality of signal conductors extending from said plurality of conductor frame webs and having free ends with contact terminal faces;

said contact terminal faces configured for connection to the contact terminals on the semiconductor chip;

said conductor frame including a plurality of flat conductors with free ends in remaining faces disposed between said plurality of conductor frame webs and said plurality of signal conductors;

said remaining faces selected from the group consisting of trapezoidal faces and triangular faces;

said plurality of flat conductors being functional elements selected from the group consisting of power supply conductors for supplying power to the semiconductor chip and volumetric balancing pieces; and at least two connecting webs disposed in parallel between one of said plurality of conductor frame webs and each of said plurality of flat conductors, each of said at least two connecting webs including a single bent area, said bent area of one of said at least two connecting webs being disposed at a distance from said one of said plurality of conductor frame webs different from a distance of said bent area of another of said at least two connecting webs from said one of said plurality of conductor frame webs.

2. The system carrier according to claim 1, wherein said contact terminal faces of said plurality of signal conductors are configured for connection to the contact terminals on the semiconductor chip using a device and a corresponding method selected from the group consisting of bonding wires using bonding wire technology and solder bumps using flip-chip technology.

3. The system carrier according to claim 1, wherein said plurality of flat conductors are formed with oblong-slot like openings and have remaining flat conductor material with a width adapted to said plurality of signal conductors.

4. The system carrier according to claim 3, wherein, in a cartesian coordinate system defining an X-direction, a Y-direction, and a Z-direction, said conductor frame extends in the X-direction and in the Y-direction, and said bent areas are disposed in the Z direction.

5. The system carrier according to claim 1, wherein, in a cartesian coordinate system defining an X-direction, a Y-direction, and a Z-direction, said conductor frame extends in the X-direction and in the Y-direction, and said bent areas are disposed in the Z direction.

6. The system carrier according to claim 5, wherein:

said plurality of signal conductors are disposed in a first plane; and said plurality of flat conductors are disposed in a second plane offset in the z direction from the first plane.

7. The system carrier according to claim 5, wherein:

one of said plurality of flat conductors includes a first one of said connecting webs connected to one of said plurality of conductor frame webs;

said one of said plurality of flat conductors includes a second one of said connecting webs connected to said one of said plurality of conductor frame webs;

said first one of said connecting webs includes one of said bent areas bent in z-direction at a first distance from said one of said plurality of conductor frame webs;

said second one of said connecting webs includes one of said bent areas bent in z-direction at a second distance from said one of said plurality of conductor frame webs; and said second distance is greater than said first distance.

8. The system carrier according to claim 5, wherein:

one of said plurality of flat conductors includes three of said connecting webs connected to one of said plurality of conductor frame webs;

said three of said connecting webs include two outer connecting webs having ones of said bent areas bent in z-direction at a first distance from said one of said plurality of conductor frame webs;

said three of said connecting webs include a middle connecting web having one of said bent areas bent in z-direction at a second distance from said one of said plurality of conductor frame webs; and said second distance is greater than said first distance.

9. The system carrier according to claim 5, wherein:

one of said plurality of flat conductors includes three of said connecting webs connected to one of said plurality of conductor frame webs;

said three of said connecting webs include two outer connecting webs having ones of said bent areas bent in z-direction at a first distance from said one of said plurality of conductor frame webs;

said three of said connecting webs include a middle connecting web having one of said bent areas bent in z-direction at a second distance from said one of said plurality of conductor frame webs; and said second distance is less than said first distance.

10. The system carrier according to claim 5, wherein:

one of said plurality of flat conductors includes a first group of said connecting webs connected to one of said plurality of conductor frame webs;

said one of said plurality of flat conductors includes a second group of said connecting webs connected to said one of said plurality of conductor frame webs;

said first group of said connecting webs includes first ones of said bent areas spaced from said one of said plurality of conductor frame webs at a first distance;

said second group of said connecting webs includes second ones of said bent areas spaced from said one of said plurality of conductor frame webs at a second distance different than said first distance; and said first group of said connecting webs and said second group of said connecting webs are alternatingly disposed.

11. The system carrier according to claim 1, wherein:

one of said plurality of flat conductors includes a first group of said connecting webs connected to one of said plurality of conductor frame webs;

said one of said plurality of flat conductors includes a second group of said connecting webs connected to said one of said plurality of conductor frame webs;

said first group of said connecting webs includes ones of said bent areas spaced at a first distance away from said one of said plurality of conductor frame webs;

said second group of said connecting webs includes ones of said bent areas spaced at a second distance away from said one of said plurality of conductor frame webs;

said second distance is greater than said first distance;

said one of said plurality of flat conductors has a first region having a greatest length, in the direction toward the free end thereof, of said one of plurality of said flat conductors; and said second group of said connecting webs is disposed in said first region.

12. The system carrier according to claim 1, wherein;

one of said plurality of flat conductors includes first ones of said bent areas connected to one of said plurality of conductor frame webs and second ones of said bent areas connected to said one of said plurality of conductor frame webs;

said first ones of said bent areas are spaced away from said one of said plurality of conductor frame webs at a first distance and said second ones of said bent areas are spaced away from said one of said plurality of conductor frame webs at a second distance;

said first ones of said bent areas and said second ones of said bent areas are disposed in an offset manner;

said second distance is greater than said first distance;

said one of said plurality of flat conductors has a first region having a greatest length, in the direction toward the free end thereof, of said one of said plurality of flat conductors; and said second ones of said bent areas are disposed in said first region.

* * * * *